(12) United States Patent
Wesström et al.

(10) Patent No.: US 11,670,907 B2
(45) Date of Patent: Jun. 6, 2023

(54) TUNABLE SEMICONDUCTOR LASER DEVICE

(71) Applicant: II-VI DELAWARE, INC., Wilmington, DE (US)

(72) Inventors: Jan-Olof Wesström, Stockholm (SE); Per Granestrand, Tyreso (SE)

(73) Assignee: II-VI DELAWARE, INC., Wilmington, DE (US)

( * ) Notice: Subject to any disclaimer, the term of this patent is extended or adjusted under 35 U.S.C. 154(b) by 439 days.

(21) Appl. No.: 16/923,945

(22) Filed: Jul. 8, 2020

(65) Prior Publication Data

US 2021/0013697 A1   Jan. 14, 2021

Related U.S. Application Data (60) Provisional application No. 62/871,536, filed on Jul. 8, 2019.

(51) Int. Cl.

| | |
|---|---|
| *H01S 3/00* | (2006.01) |
| *H01S 5/068* | (2006.01) |
| *H01S 5/125* | (2006.01) |
| *G01S 7/481* | (2006.01) |
| *H01S 5/50* | (2006.01) |
| *H01S 5/12* | (2021.01) |

(52) U.S. Cl.
CPC ............ *H01S 5/068* (2013.01); *G01S 7/4814* (2013.01); *H01S 5/125* (2013.01); *H01S 5/1243* (2013.01); *H01S 5/50* (2013.01)

(58) Field of Classification Search
None
See application file for complete search history.

(56) References Cited

U.S. PATENT DOCUMENTS

| | | | |
|---|---|---|---|
| 5,333,219 A | * | 7/1994 | Kuznetsov ............ G02F 1/2257 |
| | | | 359/344 |
| 6,862,301 B2 | | 3/2005 | Cox |
| | | | (Continued) |

FOREIGN PATENT DOCUMENTS

CN   109378707 A   *   2/2019   ............ H01S 5/0237

OTHER PUBLICATIONS

Wesstrom; "Design of a widely tunable modulation grating . . . "; IEEE; pp. 1-2 (Year: 2002).*

(Continued)

*Primary Examiner* — Mark Hellner
(74) *Attorney, Agent, or Firm* — Blank Rome LLP (57) ABSTRACT

A laser device includes front and back DBRs and an interferometer. The front DBR is coupled to a front DBR electrode. The front DBR forms a first tunable multi-peak lasing filter. The back DBR is coupled to a back DBR electrode. The back DBR forms a second tunable multi-peak lasing filter. The interferometer part is coupled between the front DBR and the back DBR. The interferometer part includes first and second waveguide combiners and first and second interferometer waveguides coupled therebetween. The first waveguide combiner couples the interferometer part to the back DBR. The second waveguide combiner couples the interferometer part to the front DBR. The first interferometer waveguide is coupled to an interferometer electrode. The interferometer forms a third tunable multi-peak lasing filter.

20 Claims, 6 Drawing Sheets

(56) References Cited

U.S. PATENT DOCUMENTS

| | | | |
|---|---|---|---|
| 7,630,425 B2 | 12/2009 | Tayebati et al. | |
| 8,041,164 B2 | 10/2011 | Granestrand et al. | |
| 8,665,917 B2 | 3/2014 | Eriksson et al. | |
| 8,792,531 B2 | 7/2014 | McCallion | |
| 8,867,579 B2 | 10/2014 | Goobar et al. | |
| 8,867,580 B2 | 10/2014 | Frisken | |
| 9,298,023 B2 | 3/2016 | McCallion | |
| 10,530,124 B2 * | 1/2020 | Cheung | H01S 5/1032 |
| 2014/0254617 A1 * | 9/2014 | Oh | H01S 3/1062 372/20 |

OTHER PUBLICATIONS

Johansson et al; "Analog performance of an InP Mach-Zehnder modulator integrated with a widely tunable laser"; IEEE pp. 277-280 (Year: 2004).*

Leuthold J., Hess R., Eckner J , Besse P.A., Melchior H.; "Spatial mode filters realized with multimode interference couplers"; Optic Letters, vol. 21, No. 11; Jun. 1, 1996; doi:10.1364/ol.21.000836; pp. 836-838.

* cited by examiner

TUNABLE SEMICONDUCTOR LASER DEVICE

CROSS-REFERENCE TO RELATED APPLICATION

This application claims the benefit of and priority to U.S. Provisional App. No. 62/871,536, filed Jul. 8, 2019, which is incorporated herein by reference.

FIELD

The embodiments discussed herein are related to a tunable semiconductor laser device. Some embodiments relate to a device that has one or more Distributed Bragg Reflectors (DBRs) that are widely tunable using an applied tuning current to achieve a desired lasing wavelength.

BACKGROUND

Unless otherwise indicated herein, the materials described herein are not prior art to the claims in the present application and are not admitted to be prior art by inclusion in this section.

Widely tunable lasers are used in Wavelength Division Multiplexed (WDM) optical transmission systems. In comparison to fixed wavelength lasers, tunable lasers can be used for several wavelengths, leading to for instance cost-efficient transmission equipment and simpler inventory management for system manufacturers. They also enable more advanced reconfigurable networks based on wavelength switching.

The subject matter claimed herein is not limited to implementations that solve any disadvantages or that operate only in environments such as those described above. Rather, this background is only provided to illustrate one example technology area where some implementations described herein may be practiced.

BRIEF SUMMARY OF SOME EXAMPLE EMBODIMENTS

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

In an example embodiment, a tunable semiconductor laser device includes a front DBR, a back DBR, and an interferometer part. The front DBR is coupled to a front DBR electrode. The front DBR forms a first tunable multi-peak lasing filter. The back DBR is coupled to a back DBR electrode. The back DBR forms a second tunable multi-peak lasing filter. The interferometer part is coupled between the front DBR and the back DBR. The interferometer part includes first and second waveguide combiners and first and second interferometer waveguides coupled between the first and second waveguide combiners. The first waveguide combiner couples the interferometer part to the back DBR. The second waveguide combiner couples the interferometer part to the front DBR. The first interferometer waveguide is coupled to an interferometer electrode. The interferometer part forms a third tunable multi-peak lasing filter.

In another example embodiment, a tunable semiconductor laser device includes a front reflector, first and second back DBRs, and an interferometer part. The first DBR is coupled to a first back DBR electrode. The first back DBR forms a first tunable multi-peak lasing filter. The second back DBR is coupled to a second back DBR electrode. The second back DBR forms a second tunable multi-peak lasing filter. The interferometer part is coupled between the front DBR and the first and second back DBRs. The interferometer part includes first and second waveguide combiners and first and second interferometer waveguides coupled therebetween. The first waveguide combiner couples the interferometer part to the first and second back DBRs. The second waveguide combiner couples the interferometer part to the front DBR. The first interferometer waveguide is coupled to an interferometer electrode. The interferometer part forms a third tunable multi-peak lasing filter. The first waveguide combiner includes two inputs, each connected to one of the first and second interferometer waveguides, and two outputs, each connected to one of the first and second back DBRs.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

The term "light" as used herein is to be construed broadly as any electromagnetic radiation that may be used for optical communication. Accordingly, light may include electromagnetic radiation in the O-band (~1261 nanometers (nm) to 1361 nm), the E-band (~1361 nm to 1461 nm), the S-band (~1461 nm to 1530 nm), the C-band (~1530 nm to 1565 nm), the L-band (1565 nm to 1625 nm), the 850 nm band, or other wavelength bands.

One group of widely tunable lasers that may be used in WDM optical transmission systems is the group of DBR-based tunable lasers, such as modulated grating Y-branch (MGY)-DBR, sampled grating (SG)-DBR, SSG-DBR, and digital supermode (DS)-DBR type lasers. Typically, such lasers are made as monolithic single chips, without moving parts. This way, they can be made small and rugged. Their tunability across a broad frequency spectrum is due to a complex interplay between their Bragg section(s) and normally also a phase section.

In such lasers, two Bragg currents are often selected to define a lasing wavelength. Then, a phase current may be selected to match this wavelength to an optical length of the laser, so that high-power, stable lasing can be achieved. To tune the laser, the Bragg and phase currents are then adjusted simultaneously to alter the lasing wavelength. A gain current must also be applied. DBR lasers and their tuning are described for instance in U.S. Pat. Nos. 8,665,917 and 8,867,579, both of which are incorporated herein by reference.

One class of such tunable lasers is the SSG-DBR class of lasers. An SSG-DBR laser includes a lasing cavity between a front DBR and a back DBR. The cavity typically includes a phase and a gain section, and a Semiconductor Optical Amplifier (SOA) component may also be arranged outside of the front DBR. Such SSG-DBR lasers are well-known as such, and are not described in detail herein.

In such SSG-DBR lasers, as well as in other types of DBR lasers, the DBR sections are tunable in a frequency periodic way to select different cavity modes and super modes, in turn determining the lasing wavelength. This tuning utilizes the Vernier effect, based on an interplay between periodicity of reflective peaks of different such DBR sections. Hence, each such DBR section forms a tunable multi-peak, periodic lasing filter for light travelling back and forth in the laser cavity.

Herein, the term "DBR laser" is to be understood to include all lasers that use at least one DBR type reflector. Hence, the above-described types of DBR lasers are non-limiting examples of such lasers. Furthermore, herein a "Bragg" section may be used to denote a DBR section.

A problem in DBR-based lasers is their relatively large frequency noise and linewidth. This is for instance the case in coherent communication systems, where the information is both amplitude and frequency modulated on the carrier light wave, where this may constitute a problem. Noise is however a problem both in low and high frequency domains. For instance, in Light Detection And Ranging (LIDAR) laser applications, low-frequency noise leads to deteriorated distance measurement performance.

It has generally proven difficult to efficiently reduce the linewidth of DBR lasers, not least due to their complex structure.

In particular, to provide a narrow linewidth the cavity can be made relatively long. A long cavity, however, requires either long DBR sections or DBR sections with short reflection frequency periodicity. Long DBR sections result in larger losses, while short reflection frequency periodicity leads to deteriorated side mode suppression ratios.

A long cavity reduces the distance between cavity modes. To select a single cavity mode, reflectors with narrow reflection peaks are needed. To obtain that, long, low loss reflectors are needed. Injecting tuning current for tuning causes loss in the form of free carrier absorption. This loss is roughly proportional to the frequency tuning caused by the current. A reflector needs to be tuned by a frequency amount that is at least the distance between reflection peaks. Therefore, a large distance between reflection peaks will cause higher loss. Hence, a small reflector peak distance is needed to obtain a narrow reflector peak. However, short reflector peak distance causes deteriorated side-mode suppression, because the reflector allows lasing at many frequencies while lasing is only desired at one particular frequency. For instance, in an SSG-DBR type laser the other reflector cannot suppress lasing on all the undesired frequencies.

Hence, there is a trade-off in DBR lasers between narrow linewidth, low side mode suppression ratio, and lasing efficiency. This trade-off is particularly difficult in case a very wide tunability is desired.

Some embodiments described herein solve this and other problems, providing a widely tunable semiconductor laser device having narrow linewidth without deteriorating side mode suppression ratio or efficiency.

Hence, some embodiments described herein relate to a tunable semiconductor laser device that includes a front DBR that has a front DBR electrode arranged to supply a front DBR tuning current to the front DBR, which front DBR forms a first periodic tunable multi-peak lasing filter. The device includes at least one back DBR that has a back DBR electrode arranged to supply a back DBR tuning current to the back DBR, which back DBR forms a second periodic tunable multi-peak lasing filter. The device includes at least one gain section that has a gain electrode arranged to supply a gain current to the gain section. The device includes an interferometer part that includes a first waveguide combiner, a second waveguide combiner, and at least two interferometer waveguides between the first and second waveguide combiners. The first interferometer waveguide includes an interferometer electrode arranged to apply an interferometer current to impart a relative phase shift between the interferometer waveguides. The interferometer part forms a third periodic tunable multi-peak lasing filter. The device may optionally include a controller, arranged to select specific combinations of the front DBR current, the back DBR current and the interferometer current to achieve lasing at different wavelengths. In some embodiments, the device is fabricated without a controller and may be subsequently coupled to a third-party controller.

Some embodiments also relate to a tunable semiconductor laser device that includes a front reflector. The device includes a first back DBR that has a first back DBR electrode arranged to supply a first back DBR tuning current to the first back DBR, which first back DBR forms a first periodic tunable multi-peak lasing filter. The device includes a second back DBR that has a second back DBR electrode arranged to supply a second back DBR tuning current to the second back DBR, which second back DBR forms a second periodic tunable multi-peak lasing filter. The device includes at least one gain section that has a gain electrode arranged to supply a gain current to the gain section. The device includes an interferometer part that includes a first waveguide combiner, a second waveguide combiner, and at least two interferometer waveguides between the first and second waveguide combiners. The first interferometer waveguide includes an interferometer electrode arranged to apply an interferometer current to impart a relative phase shift between the interferometer waveguides. The interferometer part forms a third periodic tunable multi-peak lasing filter. The second waveguide combiner includes two inputs, each connected to one of the first and second interferometer waveguides, and two outputs, each connected to one of the first and second back DBR. The device may optionally include a controller, arranged to select specific combinations of the first back DBR current, the second back DBR current, and the interferometer current to achieve lasing at different wavelengths. In some embodiments, the device is fabricated without a controller and may be subsequently coupled to a third-party controller.

Figure 1:
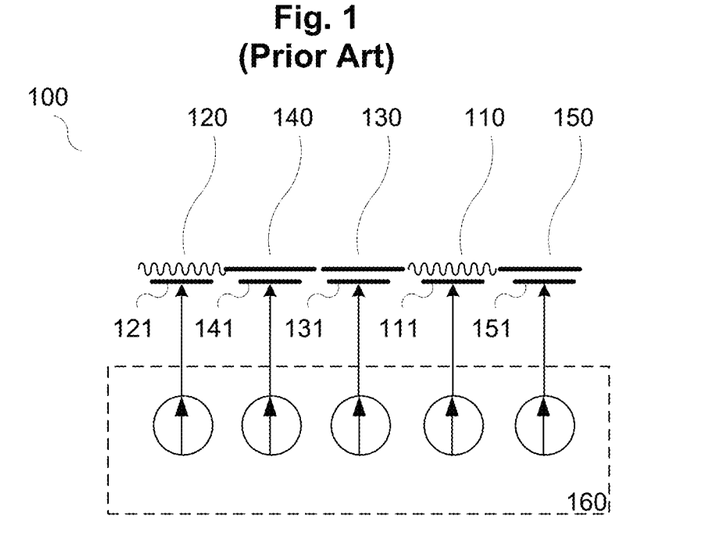
FIG. 1 illustrates a prior art tunable super structure grating (SSG)-DBR laser.

FIG. 1 illustrates a prior art tunable SSG-DBR laser 100. The SSG-DBR laser 100 includes a front DBR 110, a back DBR 120, a gain section 130, a phase section 140 and a SOA (Semiconductor Optical Amplifier) 150. As described above, such a laser 100 is tuned by supplying respective tuning currents to a front DBR electrode 111 coupled to the front DBR 110, a back DBR electrode 121 coupled to the back DBR 120, and a phase electrode 141 coupled to the phase section 140. The combination of the tuning currents to the front and rear DBR electrodes 111 and 121 decides which super mode and cavity mode should be selected for lasing, while the current to electrode 141 adjusts the lasing wavelength of the lasing cavity mode.

Tuning of the SSG-DBR laser 100 takes place using the Vernier effect based on the front and rear DBRs 110, 120 being tunable multi-peak reflectors. Namely, a reflection spectrum of each of the front and rear DBRs 110, 120 follows a comb pattern that can be translated in the frequency domain by modifying the respective tuning current to the front or rear DBR 110, 120 in question. DBRs are typically periodically multi-peak, meaning that the comb peaks occur periodically in the frequency domain whereby a particular frequency will display periodically varying reflection as the tuning current is modified linearly.

Hence, from this point of view the front and rear DBRs 110, 120 constitute multi-peak lasing filters or "mode selectors" for the SSG-DBR laser 100. The SSG-DBR laser 100 shown in FIG. 1 has two such filters. It is noted that the phase section 140 is not such a mode selector or multi-peak lasing filter, since it merely adjusts the final lasing wavelength, without being directly involved in the tuning of the lasing in terms of cavity mode and super mode selection based on the Vernier effect.

Current provided to each of a gain electrode 131 that is coupled to the gain section 130 and a SOA electrode 151 that is coupled to the SOA 150 provides power to the laser 100.

The currents provided to electrodes 111, 121, 131, 141, 151 are controlled by a laser controller 160. The controller 160 may implement conventional laser control circuitry, and will not be described in detail herein.

As is well-known in the art of tunable semiconductor lasers (such as for instance the SSG-DBR laser 100 shown in FIG. 1 that has 2 filters), in a laser that has N lasing multi-peak filters a super mode is a region in the N+1 dimensional tuning space where lasing occurs on a particular set of filter peaks for the N mode selectors. As the filters are tuned, the filter peaks are shifted in frequency. If the filters are tuned by a similar amount of frequency, the peaks will stay aligned and we will stay in the same super mode. However, if the filters are tuned by different amounts, for example if only one filter is tuned, a different set of peaks will eventually be better aligned and the laser will jump to a different super mode.

When the laser is in a particular super mode, the product of the filter peaks defines a small frequency range where lasing can occur, but the laser frequency also has to fulfil the cavity mode condition where the number of nodes for the field in the cavity has to be an integer number. This defines a tight grid of frequencies where lasing is possible. This grid is moved when the phase section is tuned.

If the filters are tuned together by a similar amount, or if the phase section is tuned by itself, we will stay in the same super mode, but the filters will select one cavity mode after the other on the grid of allowed frequencies. Therefore, within a certain super mode there will be hyper volumes in the N+1 dimensional tuning space where the laser operates with the same number of nodes in the cavity. These regions are also called cavity modes.

Within these regions, tuning is continuous without mode hops. The regions are typically elongated and tilted domains where we stay in the same cavity mode if all mode selectors are tuned by a similar frequency amount, at the same time as the phase delay of the phase section is reduced to maintain the lasing cavity mode close to composite peak of the mode selectors. In the normal case in which all N+1 tuning sections are tuned along such a trajectory, we denote such a tuning trajectory a "continuous frequency tuning path".

Such a continuous frequency tuning path covers a continuous lasing frequency range. To cover a wider range, several different cavity mode regions need to be employed. For a well-designed laser, the cavity mode regions have continuous frequency tuning ranges that are overlapping with a sufficient frequency tuning overlap, including margins that allow maintaining the frequency while avoiding switching to another cavity mode region for example in case of aging or unwanted variation of for example temperature.

There will also be hypersurfaces within the super mode where the operation switches from one cavity mode to another.

For a normal SSG-DBR laser such as the one illustrated in FIG. 1, total tuning range $f_{range}$ is limited by the size of the mode map divided by the width of the super modes $Df_{SM}$ according to equation 1:

$$f_{range} < \frac{f_{backmax} \cdot f_{frontmax}}{Df_{SM}}. \quad \text{(equation 1)}$$

In equation 1, $f_{backmax}$ is the range of achievable frequency tuning for the back reflector, while $f^{frontmax}$ is the range of achievable frequency tuning for the front reflector.

If we have similar tuning ranges for each reflector and invert we get equation 2:

$$f_{x\_max} > Df_{SM} \sqrt{\frac{f_{range}}{Df_{SM}}}. \quad \text{(equation 2)}$$

For a device with N+1 tuning sections (N for selecting the cavity mode and one phase tuner), we can generalize equation 2 to equation 3:

$$f_{x\_max} > Df_{SM} \left(\frac{f_{range}}{Df_{SM}}\right)^{\frac{1}{N}}. \quad \text{(equation 3)}$$

Setting $f_{range}$=6 terahertz (THz) and $Df_{SM}$=0.1 THz, we get:
$f_{x\_max}$=6 THz for N=1
$f_{x\_max}$=0.77 THz for N=2
$f_{x\_max}$=0.39 THz for N=3
$f_{x\_max}$=0.28 THz for N=4.

It can be noted that the expression $N*f_{x\_max}$ has a minimum at N=4.

The phase section will typically play a special role, since it is only adjusting the phase. It needs to tune by the following amount:

$$\pi\left(1 + \frac{Df_{frequency\_tuning\_overlap}}{Df_{cav}}\right),$$

where $D_{ffrequency\_tuning\_overlap}$ is the overlap between cavity modes and $Df_{cav}$ is the cavity mode distance. So if we want to maintain a certain cavity mode overlap we need to have more phase tuning in the phase section if the cavity mode distance is smaller.

The non-phase sections (mode selectors) are used to select a cavity mode. As mentioned above, the cavity mode is a continuous domain in the N+1 dimensional space without mode hops. It is closely related to the above-defined continuous frequency tuning path that is a valid concept even for N>2. It will typically require all tuning sections to be tuned. A continuous frequency tuning path is a path in the N+1 dimensional space. It most often ends at the limits of phase section tuning but also a mode selector can be limiting its length.

The concept of super modes can be generalized to higher dimensionality: The N mode selectors can be used to select one cavity mode after the other. All the mode selectors will move their filters for example to higher frequency by the same amount. This domain (the super mode) will be N-dimensional (with fixed phase section). It ends when one of the mode selectors hits its maximum or minimum value.

For N=2, the super modes can be found in a 2D mode map, but actually all of them can typically be found in a 1D (diagonal) sweep, a so-called "staircase plot".

For N=3, the super modes are tubes in a 3D domain. They can be displayed in a 2D super mode map, that is taken either in some diagonal plane or on some of the side surfaces of a 3D volume.

Suppose we want to cover a certain tuning range $f_{range}$ with for example N=3 mode selectors that are all periodic filters each with its own frequency periodicity.

Let us write the periodicity for mode selector i according to equation 4:

$$Df_{per\_i} = A \cdot N_i \quad \text{(equation 4)},$$

where A is common for all filters (i) in the device.

If we multiply two filters we get a composite filter. It turns out that if the two filters have $N_i$ that are integers without any common divisor, the composite filter has a periodicity according to equation 5:

$$Df_{per\_ij} = A \cdot N_i \cdot N_j. \quad \text{(equation 5)}.$$

For example, if we set A=100 gigahertz (GHz), $N_1$=2 and $N_2$=3, we find that $Df_{per\_1}$=200 GHz and $Df_{per\_2}$=300 GHz. As a result. $Df_{per\_12}$=100 GHz*2*3=600 GHz.

If we have three filters we can do a similar operation by modifying equation 5 to equation 6:

$$Df_{per\_123} = A*N_1*N_2*N_3 \quad \text{(equation 6)}.$$

For example, setting $N_1$=5, $N_2$=6 and $N_3$=7, the numbers 5, 6 and 7 have no common divisor and $Df_{per123}$=A*210. To cover 3 THz, we then need A to be 14.3 GHz.

Moreover, a composite filter peak car be tuned continuously by increasing frequencies of all involved filters. When a section reaches its limit of tunability, we can reset that section by one period (to a different super mode) and then continue tuning all filters together.

Figure 2:
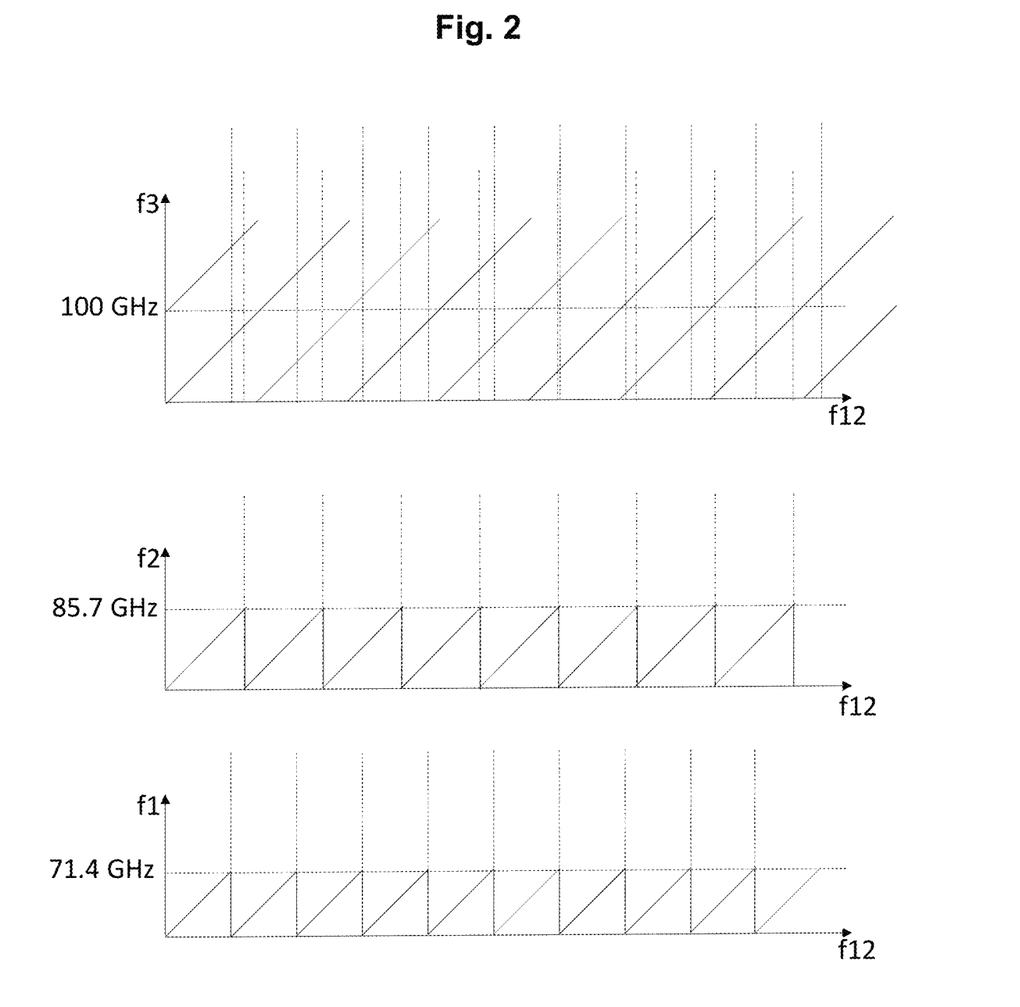
FIG. 2 is a chart illustrating quasi-continuous tuning of a composite reflector peak in a laser with three tunable mode selectors.

To visualize 3D tuning properties in 2D, one can for example make up a composite filter of filter 1 and 2. One can then sweep that composite filter in a quasi-continuous manner over for example A*5*6=~430 GHz (where A is 14.3) and simultaneously sweep the third filter over its 7*14.3=100 GHz. There will be glitches when $f_1$ or $f_2$ are reset. This is similar to how DS-DBR mode maps are conventionally presented. This is shown in FIG. 2, which is a chart illustrating quasi-continuous tuning of a composite reflector peak in a laser with three tunable mode selectors.

The patches between the glitches are slices of the super mode tubes according to the above definitions.

The stability of a laser device with N>=3, and its tolerance to less-than-accurate current sources, can be increased by optimizing its structure, according to the following.

Namely, such a device should be able to accept a large relative deviation in tuning without causing a mode hop. This should preferably be true for all tuning sections.

In other words, if we sweep up to max tuning in each section we should have as few discontinuities (mode hops) as possible.

Consider a laser structure with a cavity mode distance $Df_{cav}$, a desired range of $f_{range}$ and N=3 mode selectors #1, #2 and #3. Using the same nomenclature as above:

$$Df_{per\_i} = A*N_i \quad \text{(equation 4)},$$

$$f_{range} = Df_{per\_123} = A*N_1*N_2*N_3 \quad \text{(equation 7)}.$$

For mode selector #1, $$Df_{per\_1} = \frac{f_{range}}{N_2 N_3}. \quad \text{(equation 8)}$$

For the other mode selectors #2 and #3, corresponding equations apply.

The composite of mode selectors #1 and #2 will then have a range of $Df_{per\_12} = A*N_1*N_2$, which means the composite #12 has $N_3$ peaks within $f_{range}$.

Hence, when mode selector #3 is tuned through its period, $Df_{per\_3}$, it jumps between super modes $N_3$ times.

Because of symmetry, the same goes for the other mode selectors, so mode selector i will have $N_i$ super mode jumps before reaching max tuning.

Looking at the cavity mode structure, there are $$\frac{Df_{per\_1}}{Df_{cav}} = \frac{f_{range}/Df_{cav}}{N_2 N_3} \quad \text{(equation 9)}$$

super mode hops along axis #1. It turns out that the combination $$\frac{Df_{range}}{Df_{cav}} = N_1 N_2 N_3 \quad \text{(equation 10)}$$

yields the best tolerance of current sources having poor quality in terms of noise.

For instance, if $f_{range}=3*10^{12}$ and $Df_{cav}=16*10^9$, we get $N_3*N_2*N_1=188$ Further, $188^{1/3}=\sim5.7$.

In the next step, we obtain integers without any common divisors. For instance, the following values for ($N_1$ $N_2$ $N_3$) would yield good current noise tolerance: (5 6 7), (7 8 9) and (5 7 8).

In general, <10 features along any axis (that is, neither of the numbers $N_x$ being above 9) will be advantageous even when margins for cavity mode overlaps are taken into account.

For the particular example of N=3, the number triplet (3 4 5) has been shown to yield super modes that are wide compared to cavity modes.

The present inventor, however, has discovered that using (for the above described relative periodicity of the mode selectors used) numbers with a certain small deviation from integer values (instead of actually using integer values) yields a combined filter spectrum with lower side peaks far away in frequency from the main, lasing, peak of the combined filter spectrum. This is advantageous since it is more important to supress side peaks far from the main peak in the case that the gain spectrum is sloped. Hence, for at least one of the numbers $N_x$ (i.e. mode selectors), preferably at least several of the numbers $N_x$, in some embodiments all of the numbers $N_x$, may advantageously be selected as an integer value $\pm \Delta n$, where $0<\Delta n \leq 1$ is a deviation in % from the integer value in question.

In general, the structure of according to some embodiments herein may lead to low maximum tuning of the tuning sections, in turn leading to a more linear tuning and ultimately to larger tolerance to tuning current inaccuracy.

Namely, assume we need an accuracy of df and a tuning range of $f_{max}$ for a particular tuning section. We can then investigate what this means for the relative accuracy of the tuning currents, $dI/I_{max}$.

For ridge constructions, the tuning current can be approximated by a function such as equation 11:

$$I = I_0(e^{f/f_0} - 1) \quad \text{(equation 11)},$$

where $f_0 = 400$ GHz.

The derivative is shown in equation 12:

$$\frac{dI}{df} = \frac{I_0}{f_0} e^{f/f_0}, \quad \text{(equation 12)}$$

which means that modes will be smaller on a current scale for low currents. This is a problem since the digital-to-analog converters (DACs) also need to handle large currents, $I_{max}$, for large frequencies f, as shown in equation 13:

$$\frac{dI_{low}}{I_{max}} = \frac{df \cdot I_0 / (f_0 e^{f/f_0})}{I_0(e^{f_{max}/f_0} - 1)} \quad \text{(equation 13)}$$
$$= \frac{df}{f_0(e^{f_{max}/f_0} - 1)}$$
$$= \frac{df}{f_{max}} \bigg/ \frac{e^{f_{max}/f_0} - 1}{f_{max}/f_0}.$$

For instance, when $f_{max}/f_0$ is about 2.5, this means that there is an increased need for accuracy by a factor of about 4.5. In other words, the last divisor becomes 4.5, meaning that the relative current tolerance $dI_{low}/I_{max}$ is 1/4.5 times the relative frequency tolerance $df/f_{max}$.

It turns out that, when performing the corresponding calculations for an exemplifying laser device according to embodiments herein with N=3, the value of $f_{max}/f_0$ will be 0.77, in turn meaning that we only have a factor 1.5 increase of need for accuracy. It is noted that this is about 3 times better than for a conventional SSG-DBR laser.

This, in combination with fewer modes per range of each axis, results in a reduction of relative accuracy need of current sources for the laser device according to embodiments herein by at least 2 bits, as compared to a conventional SSG-DBR laser made in the same material system.

Figure 3:
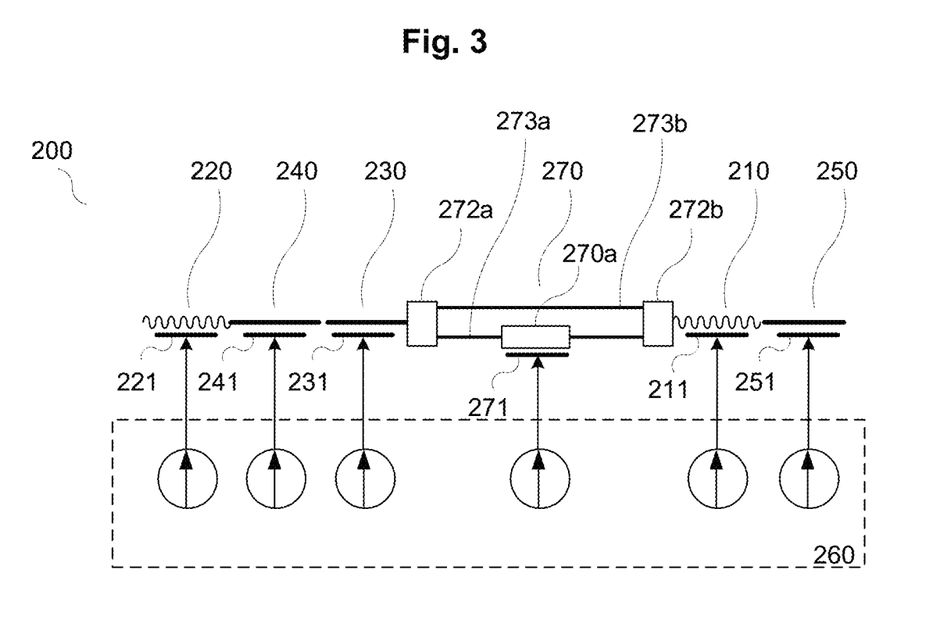
FIG. 3 illustrates an example tunable semiconductor laser device.

Hence, FIG. 3 illustrates an example tunable semiconductor laser device 200 (hereinafter "laser device 200"), arranged in accordance with at least one embodiment described herein.

The laser device 200 includes a front DBR 210 having a front DBR electrode 211 via which a laser controller 260 (which as such may be similar to controller 160, above) is arranged to supply a front DBR tuning current to the front DBR 210. The front DBR 210 forms a first tunable multi-peak lasing filter (mode selector) of the type discussed above, which in particular may be tunable in a frequency periodic manner as discussed above. The controller 260 may be omitted from the laser device 200 when fabricated and instead may be subsequently supplied and coupled to the laser device 200.

The laser device 200 also includes at least one back DBR 220. In the example illustrated in FIG. 3, there is only one back DBR 220. However, in some embodiments, other geometries are possible including more than one such back DBRs 220, that may be used for tuning of the laser device 200 simultaneously or mutually exclusively, as the case may be (see below). In particular, each such back DBR 220 forms a respective tunable multi-peak lasing filter (mode selector), which may be tunable in a frequency periodic manner as discussed above, and it is realized that any number of such tunable back DBR 220 that are used simultaneously will increase N (the number of mode selectors using the notation introduced above) by the number of back DBRs 220 in question that are simultaneously active (used for mode selection) at any given time.

Similarly to the front DBR 210, each of the one or more DBRs 220 has a respective back DBR electrode 221 via which the controller 260 is arranged to supply a respective back DBR tuning current to the back DBR 210 in question.

Furthermore, the laser device 200 includes at least one gain section 230, having a gain electrode 231 arranged to supply a gain current to the gain section 230 from the controller 260.

According to this and other embodiments, the laser device 200 further includes an interferometer part 270, in turn including a first waveguide combiner 272a, a second waveguide combiner 272b and at least two interferometer waveguides 273a, 273b between the first and second waveguide combiners 272a, 272b.

The first interferometer waveguide 273a is associated with or includes an interferometer electrode 271, arranged to apply an interferometer current to impart a controllable relative phase shift between the interferometer waveguides 273a, 273b via a phase tuning section 270a. This interferometer current is also provided by the controller 260.

The interferometer waveguides 273a, 273b shown in FIG. 3 are of equal length (a simplification for easier understanding of the geometry of the component). It is realized, however, that in order to efficiently work as a mode selecting multi peak transmission filter in the sense of embodiments herein the interferometer waveguides 273a, 273b will generally be of unequal length, at least in terms of their optical lengths.

The interferometer part 270 is a part of the laser cavity in the sense that light in the laser cavity will travel through the interferometer part 270 twice for each full cavity roundtrip, and the interferometer part 270 may impart a roundtrip transmission spectrum having a general $\sin^2(f)$ shape. As a result, the interferometer part 270 forms a third tunable multi-peak lasing filter, and in particular a frequency periodic such multi-peak lasing filter. In other words, the interferometer part 270 forms a mode selector of the above discussed type.

The controller 260, in turn, is arranged to select specific combinations of front DBR 210 current, back DBR 220 current(s) and interferometer 270 current to achieve lasing of the laser device 200 at different wavelengths.

As a result, the laser device 200 will have at least three mode selectors, in other words N≥3. Hence, the laser device 200 will produce laser light with a narrow linewidth and low side mode suppression ratio, while displaying a lasing efficiency comparable to the laser device illustrated in FIG. 1. In fact, the interferometer part 270 only introduces losses similar to a conventional phase tuning section in some embodiments.

The interferometer part 270 may be of any of a variety of constitutions or compositions. However, an example type is the so-called DLI (Delay Line Interferometer), also known as AMZI (Asymmetric Mach-Zehnder Interferometer).

As can be seen in FIG. 3, the laser device 200 may also include a phase section 240, with an associated phase electrode 241 arranged to provide a modulating phase current to the phase section 240 from the controller 260. In some embodiments (not shown in the Figures), a phase section may instead be provided as a part of the interferometer, namely in the form of a respective phase section (phase tuner) in each of the interferometer 270 arms 273a, 273b. This solution may lower the total loss of the laser device 200. An alternative way of managing without a separate phase section 240 is to instead control the temperature of the laser device 200 as described below to adapt the optical cavity length of the laser to the desired lasing wavelength.

Figure 4:
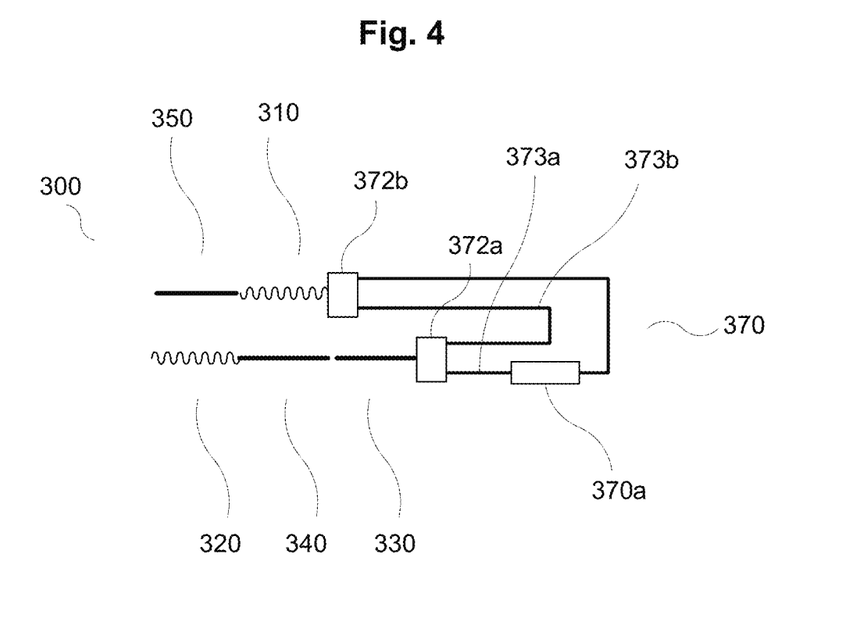
FIG. 4 illustrates another example laser device.

FIG. 4 illustrates another example tunable semiconductor laser device 300 (hereinafter "laser device 300"), arranged in accordance with at least one embodiment described herein. Although not illustrated in FIG. 4 for increased clarity, the laser device 300 may include various electrodes and a controller, such as one or more of the electrodes 211, 221, 231, 241, 251, 271 and the controller 260 of FIG. 3. The laser device 300 also includes a front DBR 310, a back DBR 320, a gain section 330, a SOA 350 and an optional phase section 340, all having the corresponding function as in the laser device 200 if FIG. 3.

The laser device 300 also has an interferometer part 370, with first and second waveguide combiner 372a, 372b, as well as a first and second waveguides 373a, 373b running between the combiners 372a, 372b. The first waveguide 373a includes a phase tuning part 370a.

As illustrated in FIG. 4, in the laser device 300 the first and second waveguides 373a, 373b have different geometric lengths, and in particular their optical path lengths are different. In an example, the optical path of the first waveguide 373a, that is the waveguide 373a that includes the phase tuning part 270a, is at least 50 μm longer, or even at least 200 μm longer, than the optical path of the second waveguide 373b.

In this and other embodiments, there may be two or more parallel interferometer waveguides 373a, 373b. In general, in some embodiments, every interferometer waveguide that has a phase tuning part 370a has a longer optical path length than all interferometer waveguides that do not have a phase tuning part.

In the example of FIG. 4, another advantageous principle of some embodiment is further illustrated, in that the first and second waveguides 373a, 373b are non-straight, i.e. curved, so that light entering the first and second waveguide combiners 372a, 372b from the first and second waveguides 373a, 373b, respectively, travels substantially in the same direction. In other words, the laser device 300 is folded so that light travelling back and forth in the laser cavity, during one and the same full circuit run, will run from the back DBR 320 in a first direction, then in a second direction opposite to the first direction, then after reflection in the front DBR 310 back in the first direction and again in the second direction back to the back DBR 320. This permits a very compact laser device 300 design, while still allowing different optical (and geometric) path lengths for the first and second waveguides 373a, 373b.

Figure 5A:
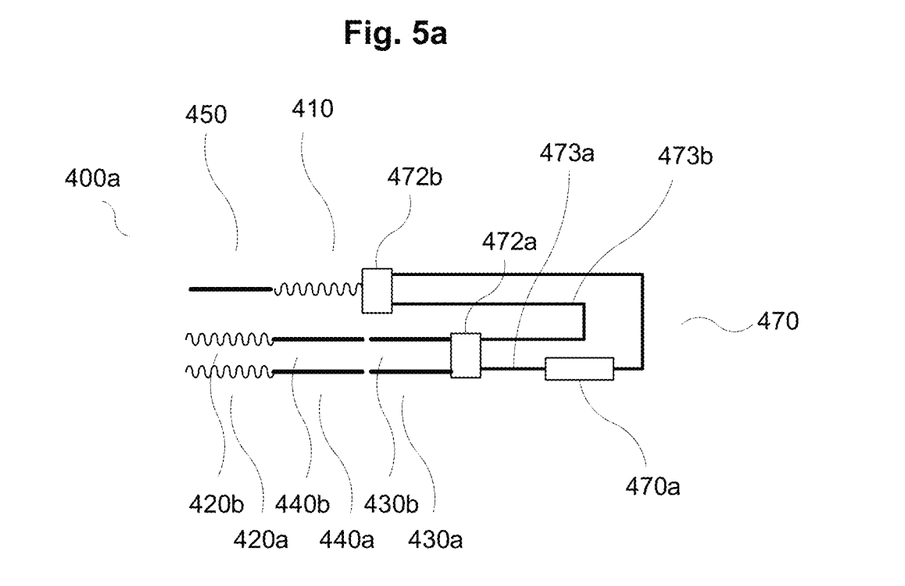
FIG. 5a illustrates another example laser device.

FIG. 5a illustrates another example tunable semiconductor laser device 400a (hereinafter "laser device 400a"), arranged in accordance with at least one embodiment described herein. Although not illustrated in FIG. 5a for increased clarity, the laser device 400a may include various electrodes and a controller, such as one or more of the electrodes 211, 221, 231, 241, 251, 271 and the controller 260 of FIG. 3.

The laser device 400a includes a front reflector 410, which may be a DBR but may also be another type of reflector, such as a simple cleaved facet. In particular, the front reflector 410 may or may not be a mode selector of the above discussed type, i.e., a tunable multi-peak lasing filter.

The laser device 400a also includes a first back DBR 420a, with a first back DBR electrode (not shown) of the type described above, arranged to supply a first back DBR tuning current to the first back DBR 420a. The first back DBR 420a hence forms a first (periodic) tunable multi-peak lasing filter.

The laser device 400a further includes a second back DBR 420b, similarly having a second back DBR electrode (not shown) in turn arranged to supply a second back DBR tuning current to the second back DBR 420b. The second back DBR 420b hence also forms a second (periodic) tunable multi-peak lasing filter.

The laser device 400a also includes at least one gain section 430a, 430b, in turn having a respective gain electrode (not shown) arranged to supply a gain current to the gain section from the controller (not shown). In the example shown in FIG. 5a, there are two independently controllable gain sections 430a and 430b, each one providing gain to a waveguide running from an interferometer part 470 of the laser device 400a to one of the respective back DBRs 420a, 420b.

The laser device 400a also includes optional phase sections 440a, 440b.

As is the case for the laser devices 200 and 300, the laser device 400a also includes the interferometer part 470, in turn including a first waveguide combiner 472a, a second waveguide combiner 472b and at least two waveguides 473a, 473b that run between the first and second waveguide combiners 472a, 472b. The first waveguide 473a includes an interferometer electrode 470a arranged to apply an interferometer current to impart a relative phase shift between the first and second waveguides 473a, 473b. Hence, in a way corresponding to the above described, the interferometer part 470 forms a third (periodic) tunable multi-peak lasing filter as has been described above.

In the laser device 400*a*, the first waveguide combiner 472*a* includes two inputs, each input being connected to one of the first and second waveguides 473*a*, 473*b*, and also two outputs, each output being connected to one of the first and second back DBRs 420*a*, 420*b*.

As used herein, the expression "connected to" intends to cover both direct and indirect connections, such as via waveguides and/or additional components such as gain sections.

The first waveguide combiner 472*a* may be or include a Multi Mode Interferometer (MMI), a semiconductor optical component type which is known as such and will not be described in detail herein. Such an MMI, however, is generally of a type M×N, where M is the number of ports on a first side and N is the number of ports on a second, opposite side. An MMI is generally configured to distribute light from the M ports across the N ports, and vice versa depending on the direction of travel of the light.

In this and other examples, the first waveguide combiner 472*a* may be or include a 2×2 MMI, distributing light between the first and second waveguides 473*a*, 473*b* and the two back DBRs 420*a*, 420*b*.

Correspondingly, the second waveguide combiner 472*b* may be or include an MMI component, such as a 1×2 MMI. It may also be or include a simpler component, such as a Y-branch combiner.

Similarly to the laser devices 200 and 300 of FIGS. 3 and 4, the laser device 400*a* of FIG. 5*a* also includes a controller (not shown), arranged to select specific combinations of the first back DBR current, the second back DBR current, and the interferometer current, to achieve lasing at different wavelengths.

In some embodiments, the front reflector 410 may hence be a front DBR that has a front DBR electrode (not shown) arranged to supply a front DBR tuning current to the front DBR 410 from the controller. If this is the case, the controller may be arranged to select a specific front DBR current to achieve the lasing at different wavelengths. In other words, in this case the front DBR 410 is a fourth mode selector/multi-peak laser filter, used for tuning the laser device 400*a*.

However, in other embodiments, the front reflector 410 may be a cleaved facet or other non mode selecting reflector. In this latter case, both back DBRs 420*a*, 420*b* may be actively used simultaneously (and tuned) in the lasing.

In all embodiments described herein, at least three mode selectors/multi-peak laser filters are actively used (and tuned) simultaneously during lasing. In other words, at least three tuning currents are simultaneously and independently supplied to different electrodes actively affecting the ongoing reflection/transmission of lasing light in the laser cavity. This means that the current lasing mode is defined by three orthogonal parameters.

Such "actively used" mode selectors are those actively participating in the lasing at any one particular point in time. Hence, in case a certain fewer number of a larger total available mode selectors are used, while the other ones are not actively tuned or even disconnected from the laser cavity, it is only the certain fewer number of mode selectors that are counted as "actively used".

There may be four or more such mode selectors in other embodiments, such as in the cascade-connected interferometers described below. However, there may advantageously be only two actively used reflecting mode selectors in the laser cavity. For instance, such reflecting mode selectors may be a tunable front and a back reflector, such as a front DBR and a back DBR as described above. Then, a DLI or other interferometer component may be used as the third mode selector, being a multi-peak transmission (as opposed to reflection) filter.

One example of when only a subset of all available mode selectors is used is illustrated in FIG. 5*a*. Namely, a waveguide connecting the first waveguide combiner 472*a* and the first back DBR 420*a* includes a first gain section 430*a*, in turn having a first gain section electrode (not shown) arranged to supply a first gain current to the first gain section 430*a* from the controller. At the same time, a waveguide connecting the first waveguide combiner 472*a* and the second back DBR 420*b* includes a second gain section 430*b*, in turn having a second gain section electrode (not shown) arranged to supply a second gain current to the second gain section 430*b*, from the controller.

However, the controller may be arranged to use only one of the two back DBRs 420*a*, 420*b* at a time as an active mode selecting reflector. Namely, the controller may be arranged to either select gain current for the back DBR 420*a* or gain current for the back DBR 420*b* so that only one of the first gain section 430*a* or the second gain section 430*b* provides sufficient positive gain to positively contribute to the lasing. For instance, the controller may be arranged to provide a desired lasing gain current to one of the gain sections 430*a*, 430*b* and to provide a gain current to the other one to effectively make the other gain section in question absorbing, so that light travelling in the waveguide in question will not contribute to the lasing.

In particular in this case, the first back DBR 420*a* and the second back DBR 420*b* may be designed with respective reflective peaks arranged to lase across two wavelengths intervals that are at least partly separated. In other words, the multi-peak reflection spectrum of the two back DBRs are different, and optimized to select lasing modes within two separate lasing frequency intervals.

Hence, in this example we have an interferometer part 470 that includes a DLI tuner which is combined with double gain sections 430*a*, 430*b* and double tunable back DBRs 420*a*, 420*b*, meaning that the two back DBRs 420*a*, 420*b* can address one part each of a desired total lasing spectrum. Hence, the tuning range is separated into two separate ranges, such as of 3 THz each. In this and other examples, the two gain sections 430*a*, 430*b* can optionally be differentiated for example in gain PL lambda, length or temperature so that the gain peak is closer to the middle of the frequency range that each back DBR 420*a*, 420*b* is responsible for. This is advantageous since on the long wavelength side of the gain peak, the linewidth enhancement factor, $\alpha_H$, is larger. This way a large linewidth enhancement factor can be avoided, thus avoiding excessive linewidth.

For the particular configuration illustrated in FIG. 5*a*, each tuning section (e.g., back DBRs 420*a*, 420*b*) may cover only 0.31 THz. That the back DBRs 420*a*, 420*b* only need to cover a limited frequency interval in turn means that corresponding tuning currents can be kept to low values. As a result, the two back DBRs 420*a*, 420*b* may be connected together without losing much in power dissipation. In general, the first and second back DBRs 420*a*, 420*b* may in fact be bonded together, in other words their electrodes may be electrically connected in a permanent way and therefore connected to the same current source.

In case of the first waveguide combiner 472*a* having more than two outputs, such as a 3×3 MMI, it is possible to arrange two of the resulting three parallel interferometer waveguides (such as the waveguides 473*a*, 473*b*) with respective individually tunable phase shifters (such as a 3-arm DLI), and to arrange three back DBRs (such as the back DBRs 420a, 420b) on a respective waveguide, each connected to a respective port of the 3×3 MMI and including a respective tunable gain section (such as the gain sections 430a, 430b), in a way otherwise corresponding to the example shown in FIG. 5a. In this case, even better selectivity may be achieved as compared to a 2-arm DLI. Also, the three gain sections and three back DBRs may in this case further reduce the range and $\alpha_H$ for each arm to about 2 THz, in the case where only one of the three gain sections is amplifying light at a time. Furthermore, the front reflector 410 may in this case be non-tunable to avoid further transmission loss.

Figure 5B:
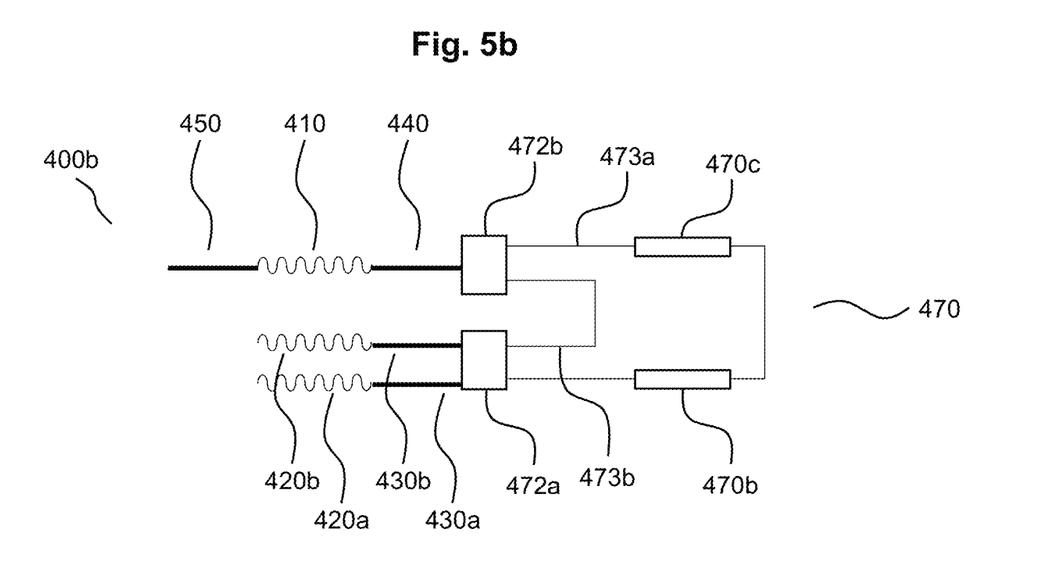
FIG. 5b illustrates another example laser device.

FIG. 5b illustrates another example tunable semiconductor laser device 400b (hereinafter "laser device 400b"), arranged in accordance with at least one embodiment described herein. The laser device 400b may include various electrodes and a controller, such as one or more of the electrodes 211, 221, 231, 241, 251, 271 and the controller 260 of FIG. 3.

The laser device 400b of FIG. 5b generally includes one or more of the same or similar components as the laser device 400a of FIG. 5A. For example, the laser device 400b of FIG. 5b includes the front reflector 410, the first back DBR 420a, the second back DBR 420b, at least one gain section 430a, 430b, and the interferometer part 470 that includes the first and second waveguide combiners 472a, 472b and the at least two waveguides 473a, 473b. The foregoing components of the laser device 400b operate and are arranged in the same or similar manner as the corresponding components of the laser device 400a of FIG. 5a. For example, the first and second back DBRs 420a, 420b of the laser device 400b may include first and second back DBR electrodes (not shown) arranged to supply first and second back DBR tuning currents to the first and second back DBRs 420a, 420b such that the first and second back dBRs 420a, 420b form first and second (periodic) tunable multi-peak lasing filters.

The laser device 400b additionally includes an optional phase section 440. In the example of FIG. 5b, a single phase section 440 is positioned between the front reflector 410 and the interferometer part 470 (more specifically, the second waveguide combiner 472b) without any other phase sections. In comparison, in FIG. 5a, the laser device 400a includes two phase sections 440a, 440a, each respectively positioned between the corresponding first or second back DBR 420a, 420b and first or second gain section 430a, 430b. Such an arrangement as illustrated in FIG. 5b uses only one phase section 440 compared to two phase sections 440a, 440b on two parallel paths as illustrated in FIG. 5a.

The phase section 440 of FIG. 5b or other phase sections herein may include a 1×1 MMI mode filter or other suitable phase section. In some embodiments, the second waveguide combiner 472b at a front end (e.g., closer to the front reflector 410) of the interferometer part 470 may include a 1×2 (or 2×1) MMI. A 1×2 (or 2×1) MMI can excite a higher order transversal odd mode in the single port (left side of the second waveguide combiner 472b in FIG. 5b) connected through the phase section 440 to the front reflector 410. If such modes are excited, the interferometer part 470 will not have a clean transmission spectrum, in the sense that it will not be able to sufficiently suppress the transmission of power at the intended frequencies. The 1×1 MMI mode filter as the phase section 440 has the property to reject higher order transversal modes, so the combination of a 1×2 (or 2×1) MMI as the second waveguide combiner 472b and a 1×1 MMI as the phase section 440 at one of the ends of the interferometer part 470 may improve the filtering capability of the interferometer part 470 which will improve the chances to select the intended frequency for lasing.

Further, when a section of any of the laser devices described herein is tuned by current injection, the intention is to change the effective index of the waveguide by changing the carrier density in the waveguide. The carrier density fluctuates because of shot noise in current injection and carrier recombination. The carrier density fluctuation translates into a fluctuation in effective index of the tuning section, which in turn causes an unwanted fluctuation of the frequency of the laser emission frequency. This can also be described as a larger linewidth for the emitted optical signal. When implementing the phase section 440 as a 1×1 MMI mode filter, the width of the tuner may increase drastically from, e.g., about 1.5 micrometers to 12 micrometers. This means the fluctuation of average carrier density will be much reduced. One way of explaining this is that the number of carriers is an integer number, and this granularity causes less fluctuation of carrier density in a tuning section of a larger volume. The end result is that implementing the phase section 440 as a 1×1 MMI mode filter may reduce the laser linewidth of the laser device 400b or other laser devices described herein.

1×1 MMIs and how they operate as mode filters are described for instance in Leuthold J, Hess R, Eckner J, Besse P A, Melchior H. *Spatial mode filters realized with multimode interference couplers. Opt Lett.* 1996; 21(11):836-838. doi:10.1364/ol.21.000836 (hereinafter "Leuthold"). Leuthold is incorporated herein by reference.

The first waveguide 473a of the interferometer part 470 of FIG. 5b includes first and second interferometer electrodes 470a, 470b arranged to apply an interferometer current to impart a relative phase shift between the first and second waveguides 473a, 473b. The first and second interferometer electrodes 470b, 470c of FIG. 5b may in aggregate be the same as or similar to the interferometer electrode 470a of FIG. 5a. In the embodiment of FIG. 5b, having two interferometer electrodes 470b, 470c rather than one interferometer electrode 470a as in FIG. 5a may save space, e.g., make the laser device 400b of FIG. 5b more compact than the laser device 400a of FIG. 5a.

In more detail, in the laser devices 300, 400a, 400b of FIGS. 4-5b, each of the waveguides 373a, 373b, 473a, 473b of the interferometer parts 370, 470 has a 180-degree bend shown in these Figures as being made up of two 90-degree bends. In practice, such a 180-degree bend may be implemented by forming each of the waveguides 373a, 373b, 473a, 473b with a curve to gradually bend the waveguide 180 degrees rather than bending the waveguide 180 degrees with two abrupt 90-degree bends. The curves of the waveguides 373a, 373b, 473a, 473b are formed with a suitable radius of curvature to prevent, or at least reduce below a threshold or minimize, optical loss through the 180-degree bend.

To have a smaller bend radius in the 180-degree bend of the waveguides 373a, 373b, 473a, 473b and thereby reduce the size of the laser devices 300, 400a, 400b, it can be beneficial to form the waveguide 373a, 373b, 473a, 473b through the 180-degree bend in a deeply etched waveguide, which is strongly guiding. However, the interferometer electrodes 370a, 470a, 470b, 470c may couple to the waveguides 373a, 373b, 473a, 473b at a location(s) formed in a shallow etched ridge which is weakly guiding.

Accordingly, the interferometer electrodes 370a, 470a, 470b, 470c may be placed not in the 180-degree bend of the waveguides 373a, 373b, 473a, 473b but instead in straight portions thereof before or after the 180-degree bend. To save space, the interferometer electrode 470a of FIG. 5a is split in two as the interferometer electrodes 470b, 470c of FIG. 5b, with the interferometer electrode 470b coupled to a lower (in the orientation of FIG. 5b) part of the waveguide 473a and the interferometer electrode 470c coupled to an upper (in the orientation of FIG. 5b) part of the same waveguide 473a on opposite sides of the 180-degree bend of the waveguide 473a. This way, most of the length difference between the longer waveguide 473a and the shorter waveguide 473b may be used for tuning, instead of using only roughly half of the length difference for tuning when the interferometer electrode 470a is placed in only the upper or lower part of the interferometer part 470 as in FIG. 5a.

Examples of strongly and weakly guiding waveguides and transitions in between, such as may be implemented in one or more of the waveguides 373a, 373b, 473a, 473b, are described for instance in U.S. Pat. No. 8,041,164 which is incorporated herein by reference.

Figure 6:
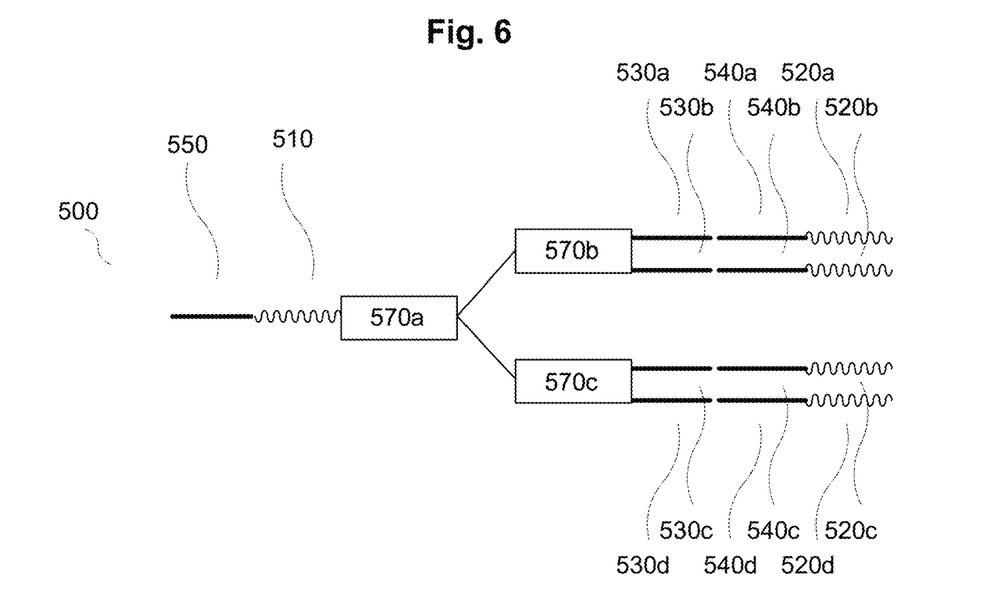
FIG. 6 illustrates another example laser device.

FIG. 6 illustrates another example tunable semiconductor laser device 500 (hereinafter "laser device 500"), arranged in accordance with at least one embodiment described herein. The laser device 500 includes several cascade connected interferometer parts 570a, 570b, 570c, each including a respective first waveguide combiner (not shown), a respective second waveguide combiner (not shown) and at least two respective interferometer waveguides (not shown) between the first and second waveguide combiners in question. Each of these interferometer parts may fully correspond to the interferometer parts 270, 370, 470 described in connection to FIGS. 3-5b, herein.

Such cascade connections means that the two output ports of one such interferometer 570a is connected to respective input ports of two other interferometers 570b and 570c. There may be more than three such cascade-connected interferometers, in two or more cascade levels. However, in some embodiments, each interferometer part 570a, 570b, 570c includes only two interferometer arms, only one of which has a tunable section to modify the relative optical path length of the two interferometer arms.

Hence, each of the cascade connected interferometer parts 570a, 570b, 570c may include, in a respective first interferometer waveguide as described above, a respective interferometer electrode arranged to apply a respective interferometer current to impart a respective relative phase shift between the first interferometer waveguides in question and a respective second interferometer waveguide of the interferometer in question, and the controller may be arranged to select a specific interferometer current for each of the cascade connected interferometer parts 570a, 570b, 570c to achieve lasing at a specific desired wavelength. In other words, each of the interferometer parts 570a, 570b, 570c may be a mode selector as described herein.

Alternatively, only a top-most interferometer part 570a may be a mode selector, while bottom-most interferometer parts 570b, 570c are not actively tuned for mode selection. In this case the bottom-most interferometer parts 570b, 570c are only used to direct the light to a desired gain and back reflector combination.

The laser device 500 further includes back reflectors 520a, 520b, 520c, 520d, each included in a different arm (referred to as a "back reflector arm") coupled to the corresponding interferometer part 570b, 570c. Each back reflector arm may include its own independently tuned gain section 530a, 530b, 530c, 530d, that may be used in a scheme similar to the one described in connection to FIG. 5a. Hence, only one of the back reflectors 520a, 520b, 520c, 520d at a time may be operated as an active mode selector, while the other three of the back reflectors 520a, 520b, 520c, 520d may be deactivated by the controller (not shown) applying a respective gain current to make the corresponding three of the gain sections 530a, 530b, 530c, 530d in question absorbing.

For instance, each combination of gain section 530a, 530b, 530c, 530d and back reflector 520a, 520b, 520c, 520d could be responsible for lasing across a separate frequency interval of 1.5 THz. The cascaded interferometer pats 570a, 570b, 570c, which may also be referred to as cascaded DLI tuners 570a, 570b, 570c, together would then be arranged to select for example one tenth of this range, so back DBRs 520a, 520b, 520c, 520d could have gratings peaks spaced by 150 GHz, even in a case in which a front tuner 510 does no mode selecting at all. Alternatively, one can consider front and back side gratings having a Vernier super period of 150 GHz, so that when these two gratings are multiplied they exhibit one peak every 150 GHz. The front and back gratings can then for example have 30 and 50 GHz spacings. Such a periodicity can for example be achieved if the reflector constitutes a Fabry-Perot cavity between two gratings bursts. A phase tuner in between the grating bursts may then be used to tune this reflector. The length of the FP cavities would then be around 1 mm and 0.66 mm, respectively.

In total in the example in FIG. 6, there are 13 electrically contacted segments. However, interferometer parts 570b and 570c can be bonded together. Also, the four back DBRs 520a, 520b, 520c, 520d can be bonded together. Furthermore, the four gain currents can use the same DAC, and a switch can be used to connect the current to one of the gain sections. Hence, in this example as few as 6 DACs may be sufficient to operate the laser device 500.

The laser device 500 also includes optional phase sections 540a, 540b, 540c, 540d.

In all of the examples provided in FIGS. 3-5a and 6, each back DBR 220, 320, 420a, 420b, 520a, 520b, 520c, 520d is associated, on the same waveguide segment, with a respective phase component or section 240, 340, 440a, 440b, 540a, 540b, 540c, 540d, each having a respective phase electrode arranged to supply a phase current to the phase component from the controller. If such a phase section is used, the controller is generally arranged to select a specific phase current to achieve the lasing at different wavelengths. To reduce the number of tuning sections and electrical connections, the phase section can be arranged between the front DBR or reflector 210, 310, 410, 510 and the DLI. For example, FIG. 5b illustrates a variation of FIG. 5a in which the phase section 440 of FIG. 5b is arranged between the front reflector 410 and the DLI or interferometer part 470, as opposed to using multiple phase sections 440a, 440b, one each between the corresponding first or second back DBRs 420a, 420b and the DLI as in FIG. 5a. Similar modifications may be made to, e.g., the embodiment of FIG. 6.

However, the use of such phase sections is not mandatory. For instance, in certain embodiments the laser device may include a temperature controller thermally coupled to a laser cavity of the laser device and arranged to impart a desired temperature to the laser cavity. Such temperature controller may be incorporated into or controlled by the controller described herein, and the controller may be arranged to select a specific desired temperature for the temperature controller to impart to the laser cavity to achieve the lasing at different wavelengths. In this case, a phase section might not be necessary.

However, in applications in which the laser device is a LIDAR (Light Detecting And Ranging) laser device, a phase section may be used for rapid laser tuning.

Some embodiments may have significant applicability for lasing within the C-band, that is between wavelengths of about 1530-1565 nm.

In all examples shown in FIGS. 3-6, the laser device 200, 300, 400a, 400b, 500 further includes a SOA 250, 350, 450, 550. The use of such a SOA is desired in many applications, but generally not mandatory.

In some embodiments, to achieve narrow linewidth with low losses, a frequency period of a first tunable multi-peak laser filter (mode selector), a frequency period of a second tunable multi-peak laser filter and a frequency period of a third tunable multi-peak laser filter of the laser device relate to each other as a triplet of natural numbers with no common divisor. For instance, the triplet of natural numbers are all below 20, such as below 10. Some examples include the triplets (5 6 7), (7 8 9) and (5 7 8).

Figure 7A:
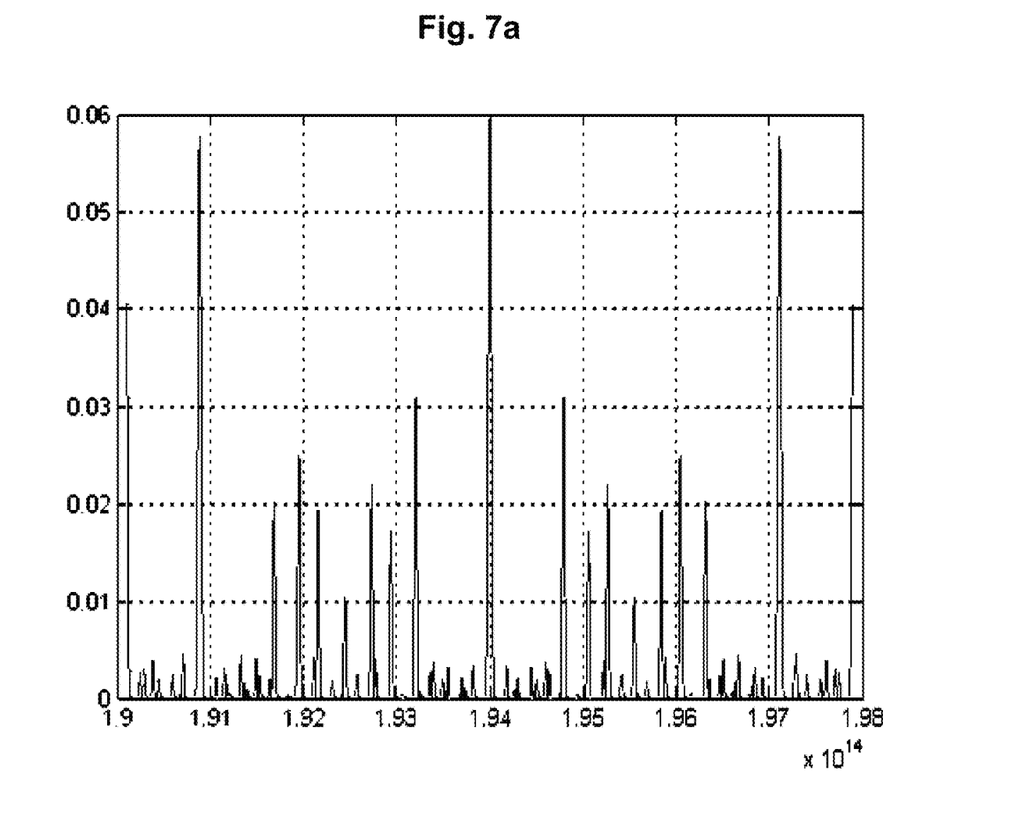
FIG. 7a is a chart illustrating a roundtrip spectrum for a laser device.
Figure 7B:
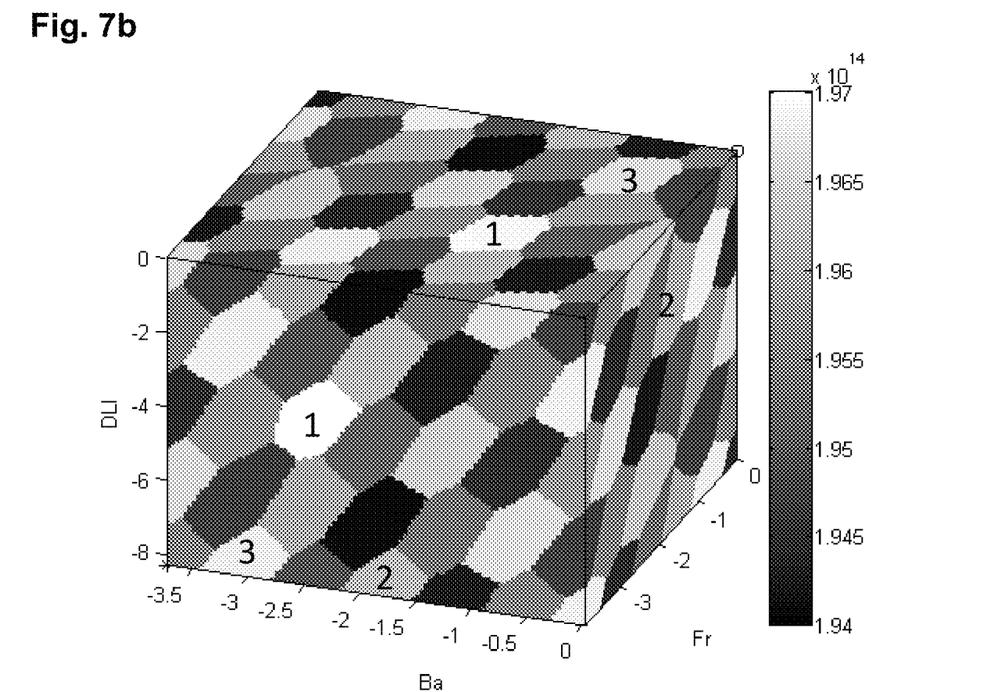
FIG. 7b is a chart illustrating a 3D section of a tuning frequency space for a laser device.
Figure 7C:
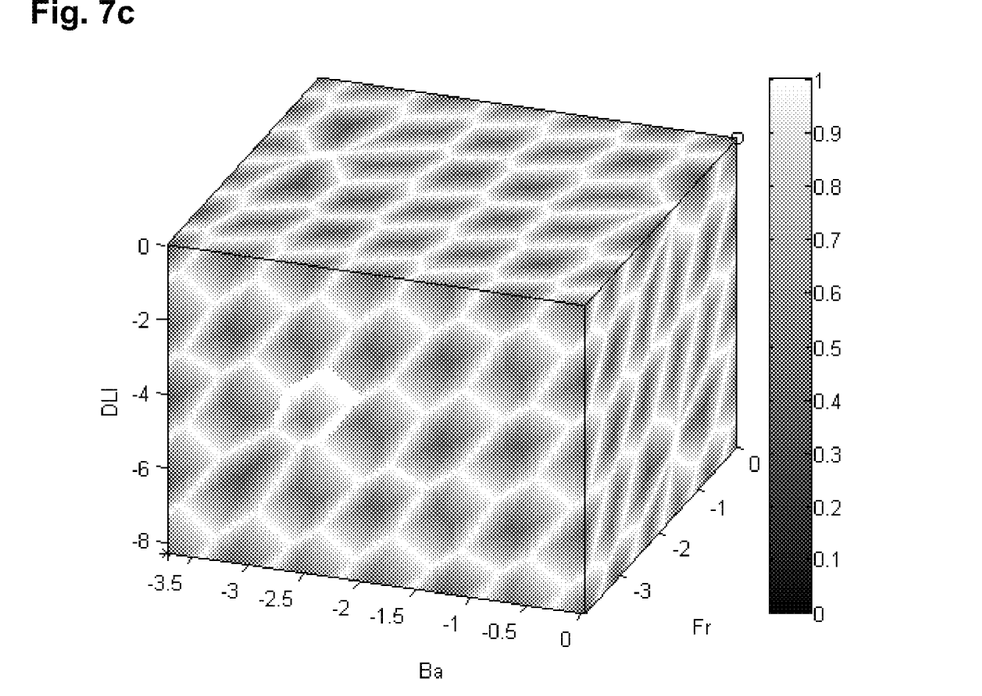
FIG. 7c is a chart illustrating a 3D section of a value space showing a round trip reflection of a highest side peak divided by the round trip reflection of a main peak for a laser device.

FIGS. 7a-7c illustrate various aspects of a laser device according to the embodiment of FIG. 5a.

In particular, FIG. 7a illustrates the round trip spectrum, $R_{back}*R_{front}*(T_{DLI})^2$ of a laser device of the type illustrated in FIG. 5a, using mode selectors in the form of a front reflector 410 with periodicity of 206.85 GHz and a length of 572 µm; a back DBR 420a with periodicity of 259.12 GHz and a length of 761 µm; and a DLI tuner 470 with a periodicity of 155.76 GHz and a path difference of 506 µm. In particular, using the same notation as above, for this laser device A=5.8214 GHz, $N_{front}$=3.9914, $N_{back}$=5.0000, $N_{DLI}$=3.0056.

Around a central peak shown in the spectrum of FIG. 7a, there is 3 THz on each side without any high peaks. If for example the back DBR is designed to have peaks only in the region 194 to 197 THz, the peaks in the roundtrip spectrum outside this range will disappear, leaving only one main peak at 194 THz. By frequency tuning each of the mode selectors upwards, the peak will move by the same amount. Whenever one mode selector reaches a tuning of one peak distance, the frequency tuning of that back DBR 420a can be reset to zero without a significant change in the roundtrip spectrum. Then, mode selectors can again be frequency tuned upwards. This way, the peak in the roundtrip spectrum can be tuned over the whole range of 194 to 197 THz.

A similar methodology applies to tuning using the other back DBR 420b, in the range 191.1 to 194.1 THz. This way, a total interval of 191.1 to 197.0 THz is covered, with a certain small overlap between the two sub intervals as a security margin, in case of variations in the manufacturing process.

FIG. 7b shows lasing frequency vs tuning of the same three mode selectors as used in FIG. 7a, in a three-dimensional view from which the cube-shaped section shown in FIG. 7b has been taken. The shade of the cube sides represents the emission frequency of the laser device at the point in question. The DLI axis represent the phase tuning of the DLI in radians. The Ba axis represents the phase tuning for each super period of the back reflector. The Fr axis represents the phase tuning for each super period of the front reflector. When a super period of a super-structure grating is phase tuned by −π, the frequency moves upwards by one peak distance. The view shown in FIG. 7b is in fact a simulation, in which the cavity mode structure has not been included. The super modes are elongated tubes through the cube. Labels, 1, 2, 3 are used to indicate that the same supermode is visible on two surfaces of the cube.

FIG. 7c illustrates, in a view corresponding to that shown in FIG. 7b and also for a laser device of the type illustrated in FIG. 5a, the ratio between the largest of the side peak and main peak of the round trip spectrum. It is seen that all super modes have areas where the ratio is lower than 0.55, which means the side peaks are well suppressed which is good for the side mode suppression ratio.

For a laser device according to the present invention, a linewidth of about 100 kHz can be expected over the C-band and at 18 dBm facet power. With high-quality electronics, channel switching times below 10 µs can be reached. Fast frequency tuning will be available, for example a linear ramp of 5 GHz over 5 µs, which is useful in LIDAR applications.

Moreover, the C-band can be extended to cover for example 6 THz, as a result of the band being effectively shared between two sub-lasers (the several independently used back reflectors).

There may also be a reduced need for current source resolution compared to plain SSG lasers because of mode structure. Since there are few super modes hops or cavity mode hops along any tuning axis in tuning space, the need for resolutions of current sources is reduced as compared to a plain SSG-DBR laser.

Above, various embodiments have been described. However, it is apparent to the skilled person that many modifications can be made to the disclosed embodiments without departing from the basic idea of the invention.

For instance, many other possible combinations of three or more mode selecting transmitting and/or reflecting components can be imagined, for instance several series-connected interferometer parts.

In general, all embodiments described herein can be freely combined, as applicable and if compatible. For example, this applies to the use of cascaded interferometer parts; folded laser geometry; the alternating use of several back DBRs; and a tunable front DBR.

Hence, the invention is not limited to the described embodiments, but can be varied within the scope of the enclosed claims.

Unless specific arrangements described herein are mutually exclusive with one another, the various implementations described herein can be combined in whole or in part to enhance system functionality or to produce complementary functions. Likewise, aspects of the implementations may be implemented in standalone arrangements. Thus, the above description has been given by way of example only and modification in detail may be made within the scope of the present invention.

With respect to the use of substantially any plural or singular terms herein, those having skill in the art can translate from the plural to the singular or from the singular to the plural as is appropriate to the context or application. The various singular/plural permutations may be expressly set forth herein for sake of clarity. A reference to an element in the singular is not intended to mean "one and only one" unless specifically stated, but rather "one or more." Moreover, nothing disclosed herein is intended to be dedicated to the public regardless of whether such disclosure is explicitly recited in the above description.

In general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that include A alone, B alone, C alone, A and B together, A and C together, B and C together, or A, B, and C together, etc.). Also, a phrase presenting two or more alternative terms, whether in the description, claims, or drawings, should be understood to include one of the terms, either of the terms, or both terms. For example, the phrase "A or B" will be understood to include the possibilities of "A" or "B" or "A and B."

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A tunable semiconductor laser device comprising:
   a front Distributed Bragg Reflector (DBR) coupled to a front DBR electrode, the front DBR forming a first tunable multi-peak lasing filter;
   a back DBR coupled to a back DBR electrode, the back DBR forming a second tunable multi-peak lasing filter;
   an interferometer part coupled between the front DBR and the back DBR, the interferometer part including:
      a first waveguide combiner that couples the interferometer part to the back DBR;
      a second waveguide combiner that couples the interferometer part to the front DBR; and
      first and second interferometer waveguides coupled between the first and second waveguide combiners,
   wherein the first interferometer waveguide is coupled to an interferometer electrode; and
   wherein the interferometer part forms a third tunable multi-peak lasing filter.

2. The tunable semiconductor laser device according to claim 1, wherein the tunable semiconductor laser device comprises multiple cascade connected interferometer parts, each comprising:
   a respective first waveguide combiner,
   a respective second waveguide combiner, and
   at least two respective interferometer waveguides between the corresponding first and second waveguide combiners,
   wherein a corresponding first interferometer waveguide of each corresponding interferometer part is coupled to a respective interferometer electrode.

3. The tunable semiconductor laser device according to claim 1, further comprising a phase section coupled between the back DBR and the first waveguide combiner, wherein the phase section is coupled to a phase electrode.

4. The tunable semiconductor laser device according to claim 1, further comprising a temperature controller thermally coupled to a laser cavity of the tunable semiconductor laser device.

5. The tunable semiconductor laser device according to claim 1, further comprising a semiconductor optical amplifier (SOA) coupled to a front of the front DBR.

6. The tunable semiconductor laser device according to claim 1, wherein the tunable semiconductor laser device is a light detecting and ranging (LIDAR) laser device.

7. The tunable semiconductor laser device according to claim 1, wherein:
   a frequency period of the first tunable multi-peak laser filter, a frequency period of the second tunable multi-peak laser filter, and a frequency period of the third tunable multi-peak laser filter relate to each other as a triplet of natural numbers with no common divisor; and
   at least one of the frequency periods is offset in relation to the natural number with more than 0% but at the most 1%.

8. A tunable semiconductor laser device comprising:
   a front reflector;
   a first back Distributed Bragg Reflector (DBR) coupled to a first back DBR electrode, the first back DBR forming a first tunable multi-peak lasing filter;
   a second back DBR coupled to a second back DBR electrode, the second back DBR forming a second tunable multi-peak lasing filter;
   an interferometer part coupled between the front reflector and the first and second back DBRs, the interferometer part, including:
      a first waveguide combiner that couples the interferometer part to the first and second back DBRs;
      a second waveguide combiner that couples the interferometer part to the front reflector; and
      first and second interferometer waveguides coupled between the first and second waveguide combiners, wherein:
         the first interferometer waveguide is coupled to an interferometer electrode;
         the interferometer part forms a third tunable multi-peak lasing filter; and
         the first waveguide combiner includes two inputs, each connected to one of the first and second interferometer waveguides, and two outputs, each connected to one of the first and second back DBRs.

9. The tunable semiconductor laser device according to claim 8, wherein the front reflector is a front DBR coupled to a front DBR electrode.

10. The tunable semiconductor laser device according to claim 8, wherein:
    a waveguide that connects the first waveguide combiner and the first back DBR includes a first gain section coupled to a first gain section electrode; and
    a waveguide that connects the first waveguide combiner and the second back DBR includes a second gain section coupled to a second gain section electrode.

11. The tunable semiconductor laser device according to claim 8, wherein the first and second back DBRs have respective reflective peaks arranged to lase across two wavelength intervals that are at least partly separated.

12. The tunable semiconductor laser device according to claim 8, wherein the first and second back DBRs are bonded together.

13. The tunable semiconductor laser device according to claim 8, wherein the tunable semiconductor laser device comprises several cascade connected interferometer parts, each comprising:
    a respective first waveguide combiner,
    a respective second waveguide combiner, and
    at least two respective interferometer waveguides between the corresponding first and second waveguide combiners,
    wherein a corresponding first interferometer waveguide of each corresponding interferometer part is coupled to a respective interferometer electrode.

14. The tunable semiconductor laser device according to claim 8, further comprising a first or second phase section coupled between the first or second back DBR and the first waveguide combiner, wherein the first or second phase section is coupled to a first or second phase electrode.

15. The tunable semiconductor laser device according to claim 8, further comprising a temperature controller thermally coupled to a laser cavity of the tunable semiconductor laser device.

16. The tunable semiconductor laser device according to claim 8, wherein:
- an optical path of the first interferometer waveguide is longer than an optical path of the second interferometer waveguide; and
- the first and second interferometer waveguides are curved so that light entering the first and second waveguide combiners from the first and second interferometer waveguides travels substantially in the same direction.

17. The tunable semiconductor laser device according to claim 8, further comprising a semiconductor optical amplifier (SOA) coupled to a front of the front reflector.

18. The tunable semiconductor laser device according to claim 8, wherein:
- a frequency period of the first tunable multi-peak laser filter, a frequency period of the second tunable multi-peak laser filter, and a frequency period of the third tunable multi-peak laser filter relate to each other as a triplet of natural numbers with no common divisor; and
- at least one of the frequency periods is offset in relation to the natural number with more than 0% but at the most 1%.

19. The tunable semiconductor laser device according to claim 9, further comprising a phase section coupled between the front reflector and the second waveguide combiner, wherein the phase section is coupled to phase electrode.

20. The tunable semiconductor laser device according to claim 19, wherein the phase section includes a 1×1 Multi Mode Interferometer (MMI) mode filter.

* * * * *